United States Patent
Angelucci (10) Patent No.: US 9,583,877 B1
(45) Date of Patent: Feb. 28, 2017

(54) INSERTION-EXTRACTION DEVICE FOR CIRCUIT CARD ASSEMBLIES RESIDENT TO THE CIRCUIT RECEIVING SIDE

(71) Applicant: Lockheed Martin Corporation, Bethesda, MD (US)

(72) Inventor: Marc T. Angelucci, Cherry Hill, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/683,332

(22) Filed: Apr. 10, 2015

(51) Int. Cl.
*H01R 13/629* (2006.01)

(52) U.S. Cl.
CPC .. *H01R 13/62938* (2013.01); *H01R 13/62955* (2013.01)

(58) Field of Classification Search
USPC ............... 439/157, 153, 310, 138; 29/750
See application file for complete search history.

(56) References Cited

U.S. PATENT DOCUMENTS

| | | | | |
|---|---|---|---|---|
| 3,451,034 A * | 6/1969 | Beale | ............................ | 439/64 |
| 4,232,926 A * | 11/1980 | Inouye et al. | ................. | 439/157 |
| 4,632,588 A * | 12/1986 | Fitzpatrick | ....................... | 403/16 |
| 4,975,073 A * | 12/1990 | Weisman | ....................... | 439/157 |
| 5,074,800 A * | 12/1991 | Sasao et al. | ................... | 439/157 |
| 5,389,000 A * | 2/1995 | DiViesti et al. | ............... | 439/157 |
| 5,542,854 A * | 8/1996 | Bowen | ........................... | 439/157 |
| 5,658,162 A * | 8/1997 | Harting et al. | ................ | 439/372 |
| 5,825,616 A * | 10/1998 | Howell et al. | ............. | 361/679.38 |
| 7,408,788 B2 * | 8/2008 | Rubenstein | .................... | 361/801 |
| 7,717,723 B2 * | 5/2010 | Nehm | ........................... | 439/157 |
| 2005/0207135 A1* | 9/2005 | Heussi | ............................ | 361/801 |
| 2006/0018105 A1* | 1/2006 | Suzue et al. | ................... | 361/798 |
| 2006/0134953 A1* | 6/2006 | Williams et al. | .............. | 439/157 |

\* cited by examiner

*Primary Examiner* — Alexander Gilman
(74) *Attorney, Agent, or Firm* — Howard IP Law Group, P.C.

(57) ABSTRACT

A system for selectively inserting and/or extracting an electronics module into and/or from a receiving system. The system includes a lever configured to rotatably attach to a portion of the receiving system. The lever is rotatable between a first position corresponding to an at least partially uninstalled position of the electronics module with respect to the receiving system and a second position corresponding to an installed position of the electronics module with respect to the receiving system. The lever includes a first bearing surface configured to engage with and apply a force on a portion of the electronics module when the lever is rotated in a first direction, and a second bearing surface configured to engage with and apply a force on a portion of the electronics module when the lever is rotated in a second direction.

20 Claims, 11 Drawing Sheets

INSERTION-EXTRACTION DEVICE FOR CIRCUIT CARD ASSEMBLIES RESIDENT TO THE CIRCUIT RECEIVING SIDE

FIELD OF THE INVENTION

The present invention relates to retaining systems for line-replaceable units (LRUs), and more specifically, to systems for aiding in the insertion, retention, and removal or extraction of electronics modules, including printed wire/circuit boards (PWBs/PCBs) or "circuit cards".

BACKGROUND

Figure 1:
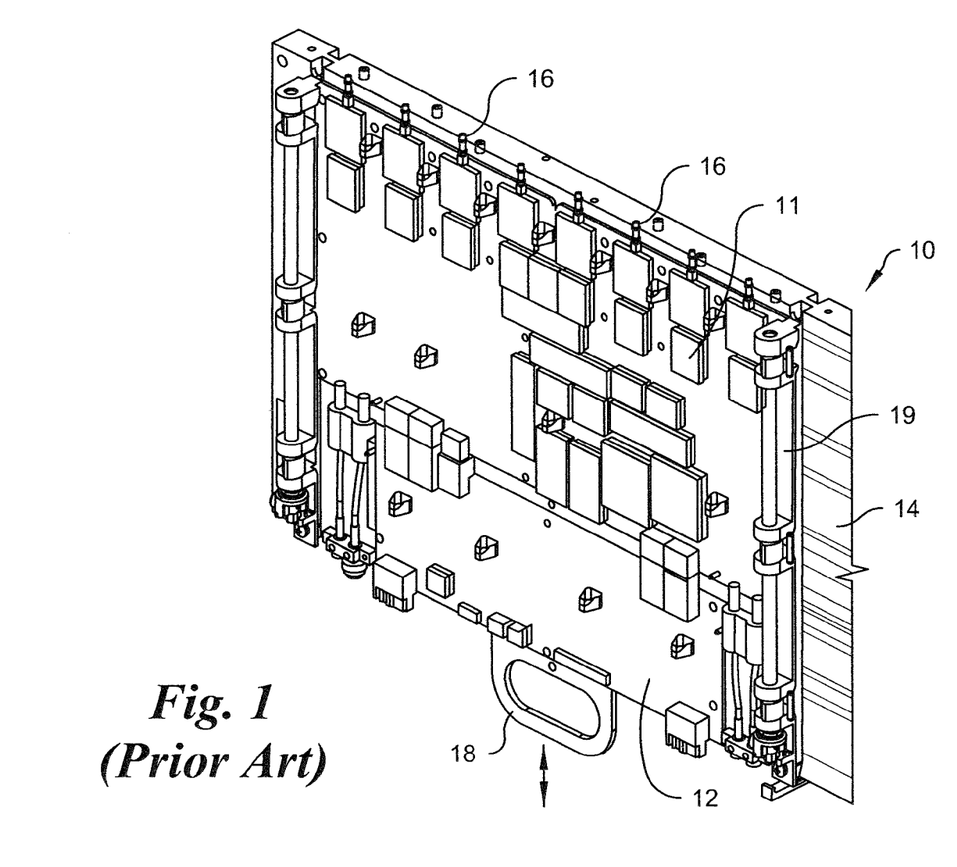
FIG. 1 is a partial perspective view of a circuit card arranged in an installed position on a card receiving system.

Modern electronic systems are often implemented using removable units containing electronic components. These units (referred to herein as electronics modules or circuit cards) are operatively connected to a receiving platform, chassis or motherboard of a larger card receiving system via one or more removable electronic connectors. FIG. 1 partially illustrates a circuit card or LRU receiving system 10. System 10 may include a receiving platform 14, such as a cooling chassis or cold wall, onto which a circuit card 12, including a plurality of electronic components 11, is to be placed and secured in an operative state. Circuit card 12 may comprise electrical connectors 16 configured to engage with corresponding connectors (not shown) on receiving platform 14 (or a motherboard thereof). Once installed, circuit card 12 may be secured to receiving platform 14 via a clamping device 19 (only a portion of which is shown).

These arrangements provide for quick replacement or repair, simplified system packaging and reduced cost. However, installing and/or removing these circuit cards may require the application of significant force onto the card to overcome friction or other reactive forces required to engage or disengage these electronic connectors. According to embodiments of the prior art, forces required to insert and/or extract circuit card 12 from an installed position may be applied in the indicated directions via, for example, a handle 18 arranged thereon. Other prior art solutions aimed at aiding in the process of circuit card insertion and extraction include the use of moveable mechanical devices arranged on the circuit card. However, as these devices are fitted to the circuit cards themselves, card complexity and overall costs are greatly increased, as each circuit card, as well as all replacement and/or backup circuit cards, must be fitted with the devices. Mounting devices on the receiving side of a system (e.g. to receiving platform 14) can greatly reduce costs, limiting the number of devices required. However, current receiving side mounted solutions include devices for aiding only in circuit card extraction, and lack the functionality to perform insertion or installation operations.

Improved systems and methods for aiding in both the insertion and extraction of circuit cards are desired.

SUMMARY

According to one embodiment of the present disclosure, a system for selectively inserting and/or extracting an electronics module into and/or from a receiving system is provided. The system includes a lever configured to moveably or rotatably attach to a portion of the receiving system. The lever is rotatable between a first position corresponding to an installed position of the electronics module with respect to the receiving system, and a second position corresponding to an at least partially uninstalled position of the electronics module with respect to the receiving system. The lever comprises a first bearing surface configured to engage with and apply a force on a portion of the circuit card when the lever is rotated in a first direction, and a second bearing surface configured to engage with and apply a force on a portion of the circuit card when the lever is rotated in a second direction. The system further includes a locking mechanism attached to the lever. The locking mechanism is moveable between a first unlocked position and a second locked position and is configured to selectively engage with a portion of the receiving system in the second locked position for preventing the lever from being rotated with respect to the receiving system.

In another embodiment, a receiving system for electronics modules is provided. The system comprises a receiving platform having a surface for supporting an electronics module. A lever is rotatably mounted to the receiving platform. The lever is moveable or rotatable between a first position corresponding to an installed position of the electronics module with respect to the receiving system, and a second position corresponding to an at least partially uninstalled position of the electronics module with respect to the receiving system. The lever includes a first bearing surface configured to engage with a portion of the electronics module when the lever is rotated in a first direction, and a second bearing surface configured to engage with a portion of the electronics module when the lever is rotated in a second direction. A locking mechanism may also be provided for selectively securing the lever in the first position with respect to the receiving system.

In yet another embodiment, a method for inserting an electronics module into a receiving system is provided. The method includes the steps of engaging a first bearing surface of a lever pivotally mounted to the receiving system with a portion of the electronics module. The electronics module is displaced in a first direction from an at least partially uninstalled position and into an installed position with respect to the receiving system via rotation of the lever in a first direction.

DETAILED DESCRIPTION

It is to be understood that the figures and descriptions of the present invention have been simplified to illustrate elements that are relevant for a clear understanding of the present invention, while eliminating, for purposes of clarity, many other elements found in LRU or circuit card retaining or receiving systems. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include improved systems and methods for inserting (i.e. installing) and extracting (i.e. removing) an LRU, circuit card or electronics module to and/or from a circuit card receiving system. In one embodiment, the system comprises a handle or lever moveably (e.g. pivotally) mounted to a receiving platform of a circuit card receiving system. The lever includes at least first and second bearing surfaces configured to engage with one or more portions of a circuit card to be inserted or extracted. The lever is rotatable or otherwise moveable with respect to the receiving platform between a first position, wherein a circuit card may be positioned in preparation for insertion into the circuit card receiving system, and a second position, wherein the circuit card is biased or displaced into an installed or inserted position with respect to the receiving system.

In one embodiment, with a circuit card in an uninstalled, or at least partially uninstalled position, applying a force on the lever in the first position provides contact engagement between the first bearing surface of the lever and a bearing pin arranged on the circuit card. Further rotation of the lever is operative to urge the circuit card into an installed state via a force exerted between the first bearing surface and the bearing pin. Likewise, with a circuit card in an installed state, applying an opposite force on the lever in the second position causes the lever to provide contact engagement between the second bearing surface of the lever and the bearing pin of the circuit card. Further rotation of the lever urges the circuit card into an uninstalled state via a force exerted between the second bearing surface and the bearing pin.

In one embodiment, the system further comprises a locking assembly for securing the lever in the second or installed position. More specifically, the locking assembly may include a locking catch pivotally mounted to the lever and configured to engage with a locking pin associated with the receiving platform of the card receiving system. Engagement of the locking catch and the locking pin is operative to fix the position of the lever, and, for example, secure a circuit card in an installed position. In one embodiment, the locking catch may be resiliently mounted, such that it is biased into a locked or engaged position (e.g. via a spring element). In this embodiment, releasing the locking catch from the locked position requires the application of a force against the biasing force.

Figure 2A:
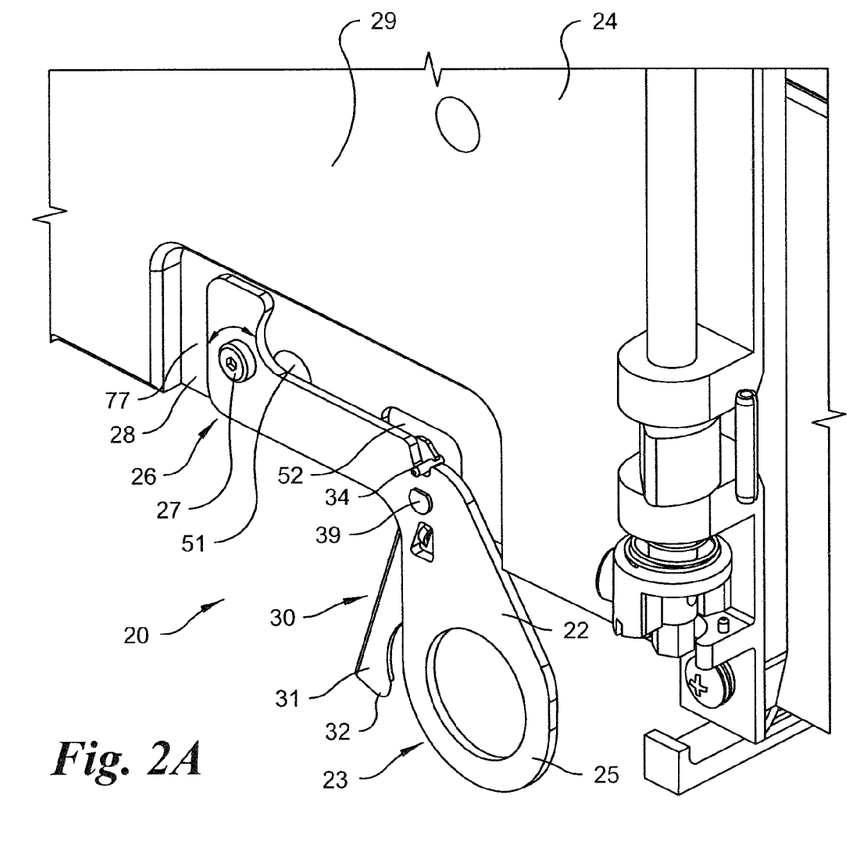
FIGS. 2A-2C are perspective views of a circuit card receiving platform including a system for inserting and/or extracting circuit cards according to an embodiment of the present disclosure.
Figure 2B:
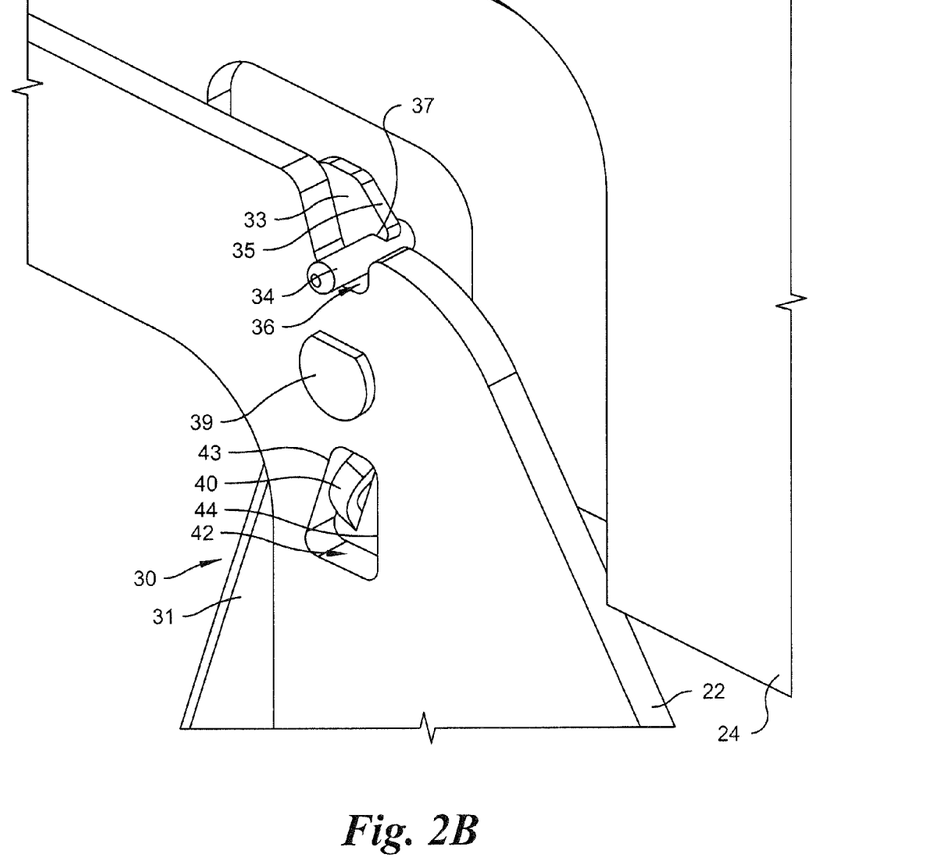
Figure 2C:
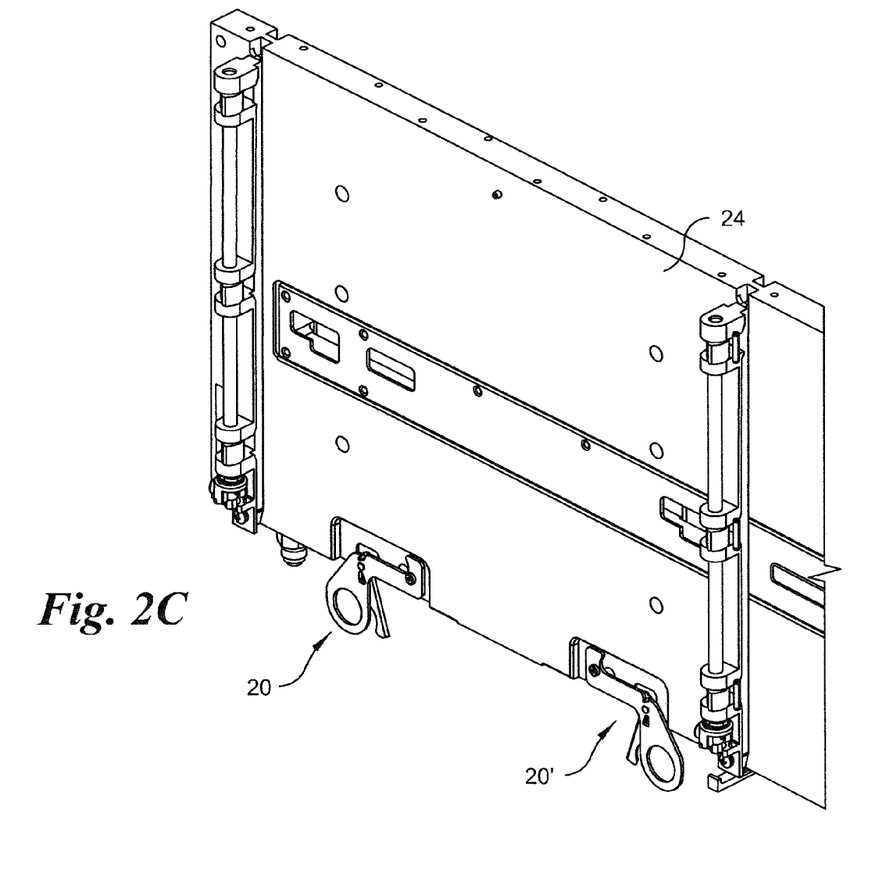
Figure 4:
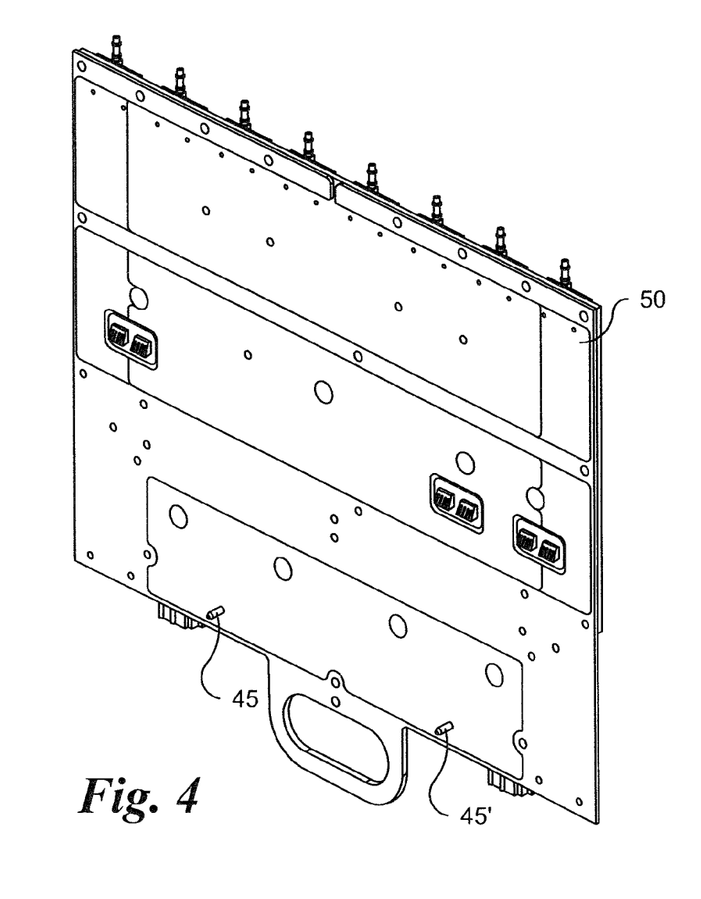
FIG. 4 is a perspective view of a circuit card according to an embodiment of the present disclosure including one or more bearing pins arranged thereon.

Referring generally to FIGS. 2A-2C, an exemplary embodiment of an electronics module or circuit card insertion and/or extraction system according to the present disclosure is shown. System 20 includes a lever 22 having a first end 23 defining a handle portion 25, and a second end 26. As shown, lever 22 is pivotally mounted to a receiving platform 24 (e.g. a cold plate of a circuit card receiving system) proximate second end 26 via, for example, a fastener 27 (e.g. an at least partially threaded fastener). System 20, including lever 22, may be mounted within a first recessed area or recess 28 formed in receiving platform 24. Recess 28 comprises a generally planar mounting surface 77 arranged generally below planar surface 29 of receiving platform 24. In this way, system 20 will not prevent a circuit card (not shown) from achieving uniform contact with a planar surface 29 of receiving platform 24. Lever 22 is configured to move or pivot about an axis defined by fastener 27 in the directions illustrated, and substantially within a plane that is generally parallel to planar surface 29 of receiving platform 24. In this way, lever 22 is configured to move within a plane parallel to a direction of motion required for a circuit card to be inserted and/or extracted to and/or from receiving platform 24. Additional recesses 51,52 may be formed in recess 28 of receiving platform 24 for accommodating a bearing pin of a circuit card (as shown in FIG. 4), and a locking assembly 30, respectively, when a circuit card is arranged in an installed position and lever 22 is arranged in a locked position, as will be set forth in greater detail herein.

Figure 3:
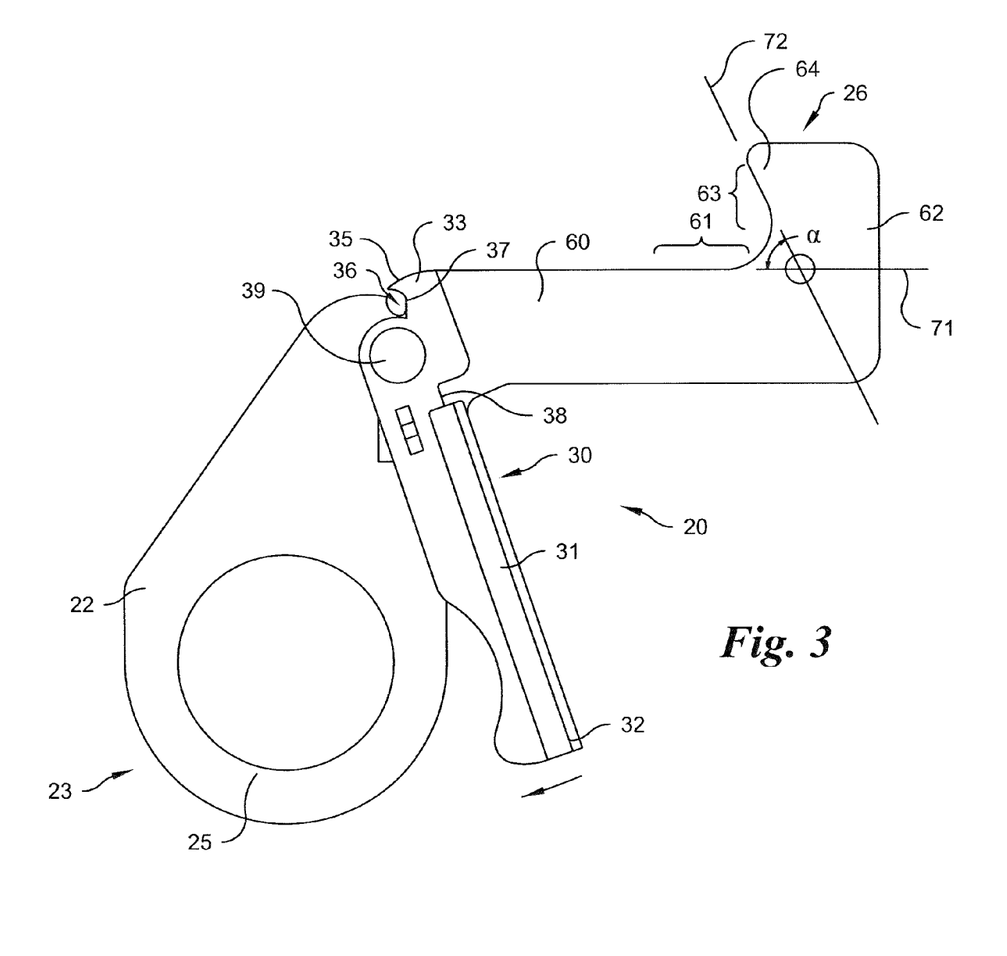
FIG. 3 is a bottom perspective view of the system for inserting and/or retracting circuit cards shown in FIGS. 2A-2C.

Referring generally to FIG. 3, in one embodiment, lever 22 comprises a major elongated body portion 60 defining a first bearing surface 61 and a minor elongated body portion 62 at second end 26 thereof defining a second bearing surface 63. In one embodiment, the respective directions of elongation of major body portion 60 and minor body portion 62 are arranged generally perpendicular to one another, defining a lever having an at least partial "L" shaped profile. In a further embodiment, minor body portion 62 includes a curved or hooked end portion 64 defining second bearing surface 63. As illustrated, at least one portion of first bearing surface 61 is defined by a first plane 71 which is oriented such that it intersects a second plane 72 defining a portion of second bearing surface 63 at a non-zero acute angle α. In the illustrated embodiment, handle portion 25 of first end 23 of lever 22 extends in a direction generally opposite to the direction of elongation of minor body portion 62. As will be set forth in greater detail, first and second bearing surfaces 61,63 are positioned on respective edges of major body portion 60 and minor body portion 62 and are oriented such that they are configured to engage with a portion of a circuit card (e.g. a bearing pin) during respective insertion and extraction operations.

Still referring to FIG. 3, as well as again to FIGS. 2A-2C, system 20 may further comprise locking assembly 30, including a locking catch 31. Locking catch 31 may be pivotally or rotatably mounted to lever 22 via a fastener 39, and moveable between a locked position (as illustrated in FIGS. 2A-2C and 3) and an unlocked position (not shown). More specifically, locking catch 31 includes a first end 32 and a second end 33. Second end 33 is sized to engage with a locking pin 34 fitted on receiving platform 24 when in the illustrated locked position. Locking catch 31 may be biased into the locked position via, for example, a spring element 38, such as a torsion spring or a leaf spring, arranged between lever 22 and locking catch 31.

FIG. 2B shows a more detailed view of the structure and operation of locking assembly 30. System 20 is shown in the locked position, wherein a circuit card (not shown) would be arranged in an installed position with respect to receiving platform 24. As lever 22 is biased into an installed position, locking pin 34 may contact a tapered surface 35 of locking catch 31. Rotation of lever 22 in a counter-clockwise direction may bias locking catch 31 into an unlocked position (i.e. in the direction indicated in FIG. 3), wherein locking pin 34 may engage with a recess 36 formed in lever 22. Once locking pin 34 is engaged within recess 36, locking catch 31 is free to rotate into a locked position under bias of spring element 38, wherein a recessed portion 37 of locking catch 31 captures locking pin 34 within recess 36. It should be understood that in the illustrated locked position, lever 22 is restrained from rotation via the engagement of lever 22 and locking catch 31 with locking pin 34, thus securing a circuit card (not shown) to the receiving platform 24. Likewise, in the unlocked position, lever 22 may be free to rotate with respect to receiving platform 24.

Locking catch 31 may be biased or moved between the locked position (shown) and the unlocked position (not shown) via a force placed on first end 32 of locking catch 31 in the direction indicated by the arrow in FIG. 3. Still referring to FIG. 2B, rotational movement of locking catch 31 may be limited via, for example, a protrusion 40 formed on locking catch 31 which engages with an opening 42 formed in lever 22. In the locked position, protrusion 40 may abut a first internal wall 43 defining opening 42. Rotating locking catch 31 from the illustrated locked position causes protrusion 40 to abut a second internal wall 44 of opening 42 corresponding to an unlocked position.

FIG. 2C illustrates an embodiment of the present disclosure, wherein receiving platform 24 is fitted with two circuit card insertion and/or extraction systems 20,20' as described above with respect to FIGS. 2A, 2B and 3. Each system 20,20' may be configured to engage with a respective bearing pin mounted to an exemplary circuit card. For example, FIG. 4 illustrates an exemplary circuit card 50 according to an embodiment of the present disclosure. As set forth above, circuit card 50 may comprise bearing pins 45,45' attached thereto, or installed therein, for engaging with respective insertion and/or extraction systems 20,20' for urging circuit card 50 into or from an installed position with respect to receiving platform 24.

Figure 5A:
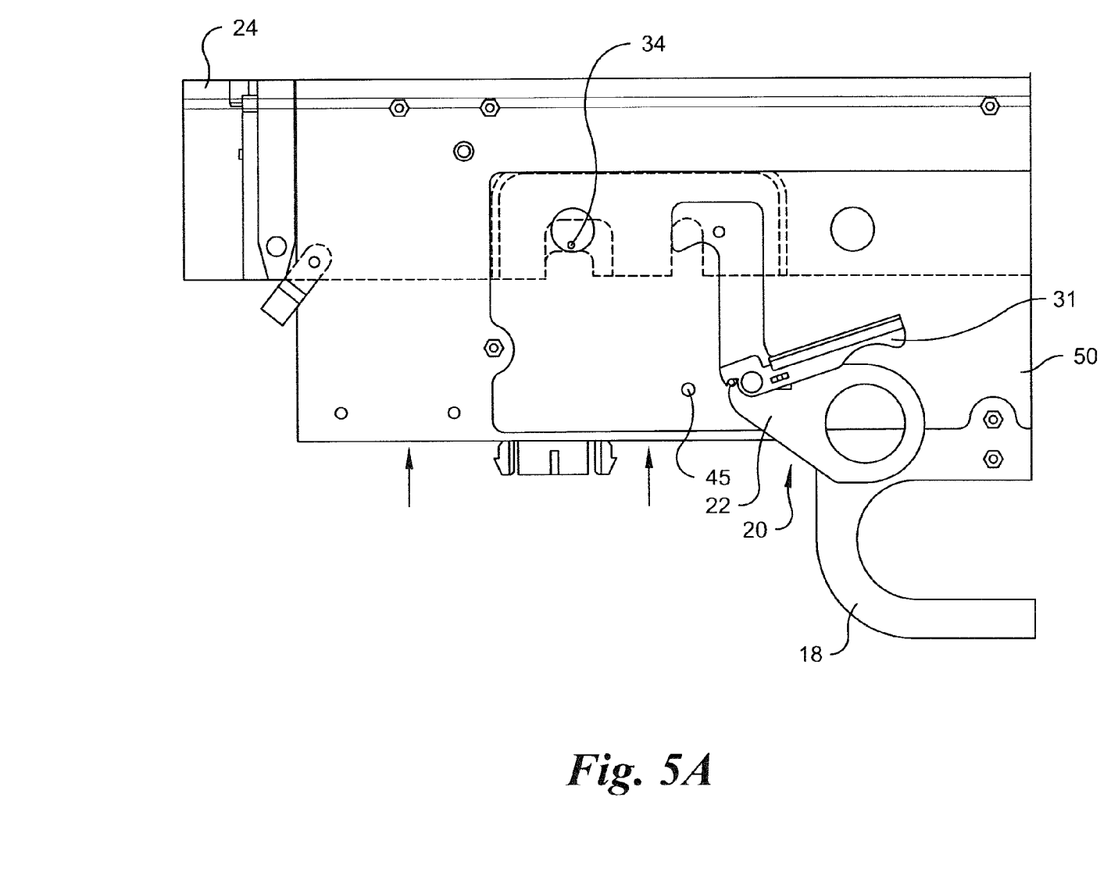
FIGS. 5A-5C are perspective views illustrating a circuit card insertion function of a system according to an embodiment of the present disclosure.
Figure 5B:
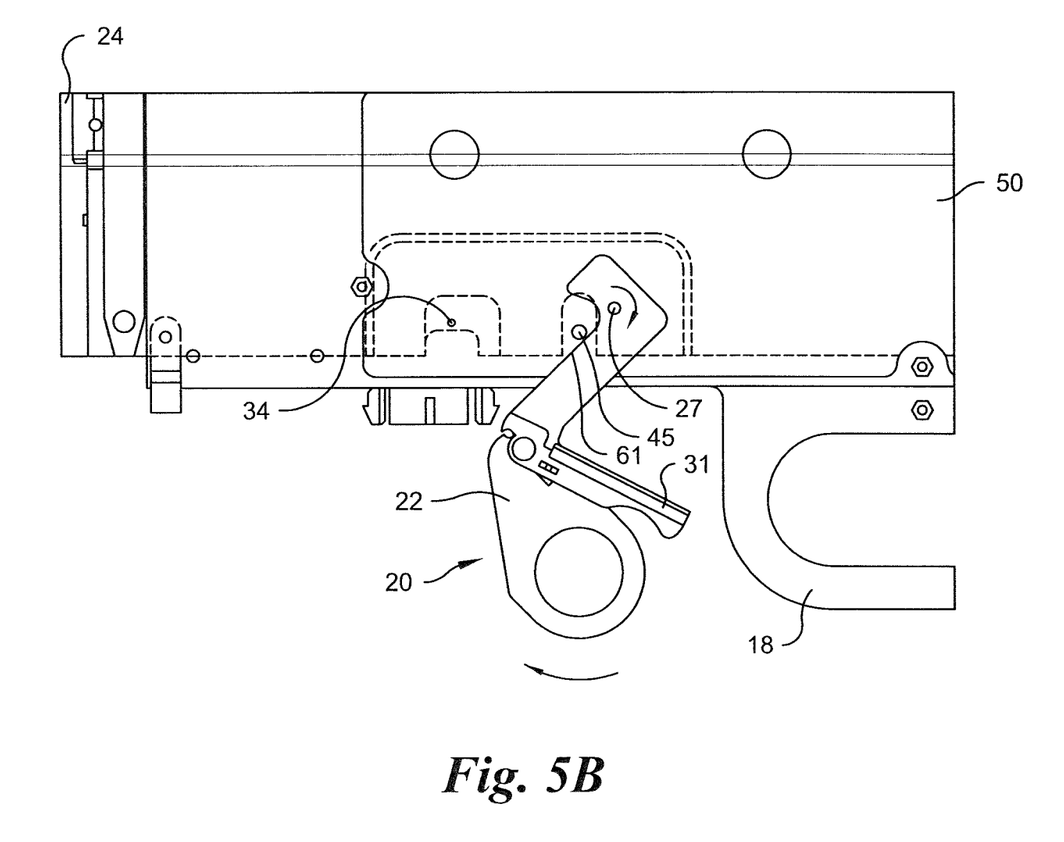
Figure 5C:
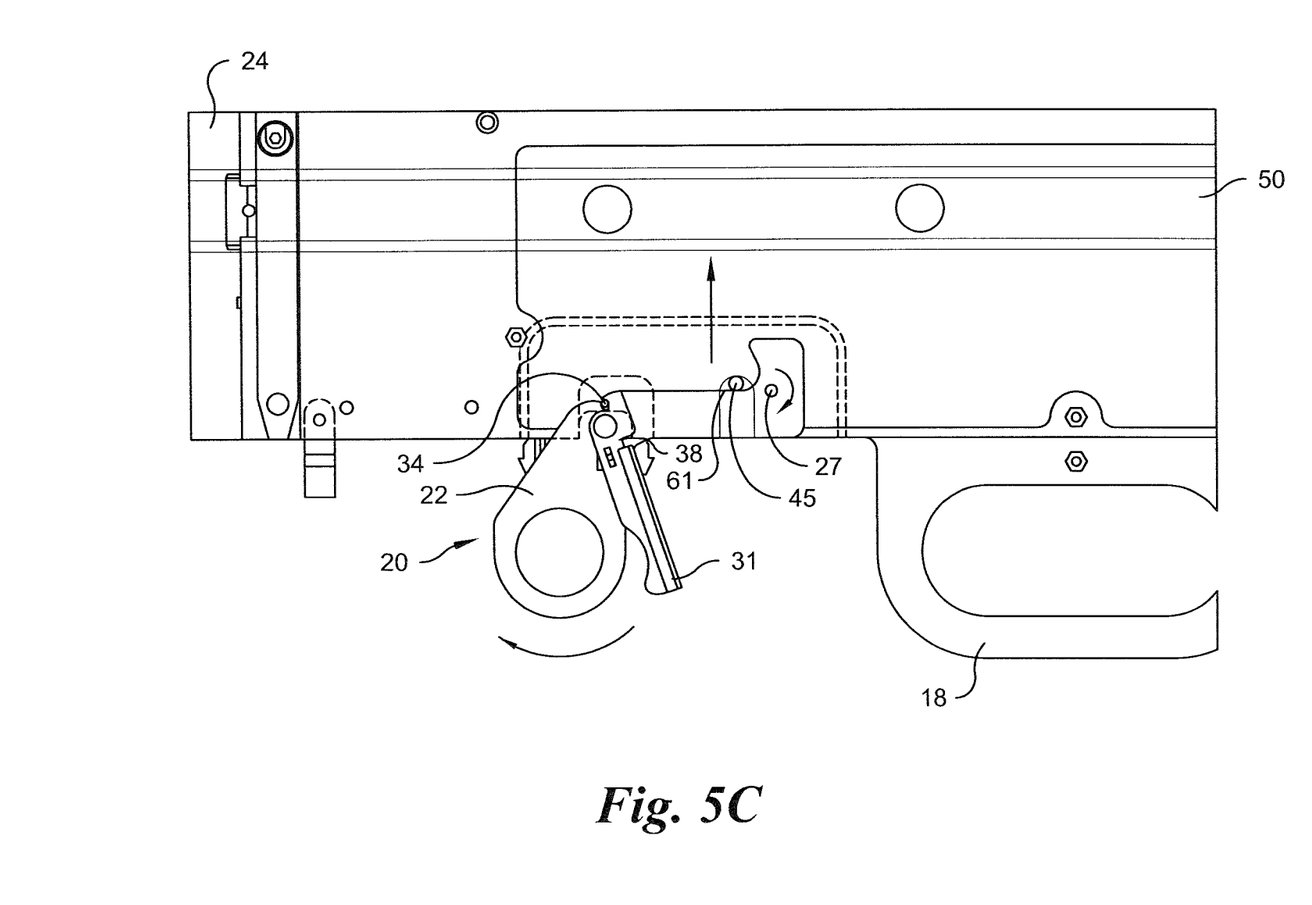

FIGS. 5A-5C illustrate an insertion or installation function of system 20 according to an embodiment of the present disclosure. Referring to FIG. 5A, circuit card 50 is shown in a partially uninstalled state, with a planar surface thereof resting on a surface of receiving platform 24 (e.g. on surface 29, as illustrated in FIG. 2A). Of note, receiving platform 24 is shown in a transparent manner, so as to illustrate the function of embodiments of the present disclosure more clearly. System 20, including lever 22, resides in an unlocked position, wherein locking catch 31 and lever 22 are not engaged with locking pin 34 of receiving platform 24. A user installing circuit card 50 may begin to bias circuit card 50 toward an installed position in the direction indicated by the arrows via a force placed on handle 18.

As shown in FIG. 5B, once inserted a suitable distance (e.g. up to an initial point of contact between electrical connectors of circuit card 50 and the corresponding connectors of receiving platform 24), a user may begin to rotate lever 22 of system 20 in the clockwise direction indicated about the pivot point defined through fastener 27. Lever 22 may be rotated until first bearing surface 61 of lever 22 contacts bearing pin 45 arranged on circuit card 50. Referring to FIG. 5C, continued rotation of lever 22 in the clockwise direction urges circuit card 50 in the direction indicated and into an installed or inserted position (e.g. engages electronic connections, not shown, between circuit card 50 and receiving platform 24). Between the positions illustrated in FIGS. 5B and 5C, locking catch 31 (e.g. tapered surface 35 thereof, FIG. 2B) has been rotated into contact engagement with locking pin 34 of receiving platform 24. Continued rotation of lever 22 results in locking pin 34 bearing on and rotating locking catch 31 in a clockwise direction into an unlocked position, against a biasing force applied thereon by spring element 38. It should also be understood that a user may manually rotate locking catch 31 in the clockwise direction into the unlocked position. Further rotation of lever 22 into the position illustrated in FIG. 5C engages locking pin 34 within recess 36 of lever 22 (see FIG. 2B), wherein locking catch 31 may return to the locked position, capturing locking pin 34, and securing system 20 in the illustrated locked position. In the locked position, circuit card 50 is retained in the inserted or installed state via the abutment of bearing surface 61 of lever 22 on bearing pin 45 of circuit card 50.

Figure 6A:
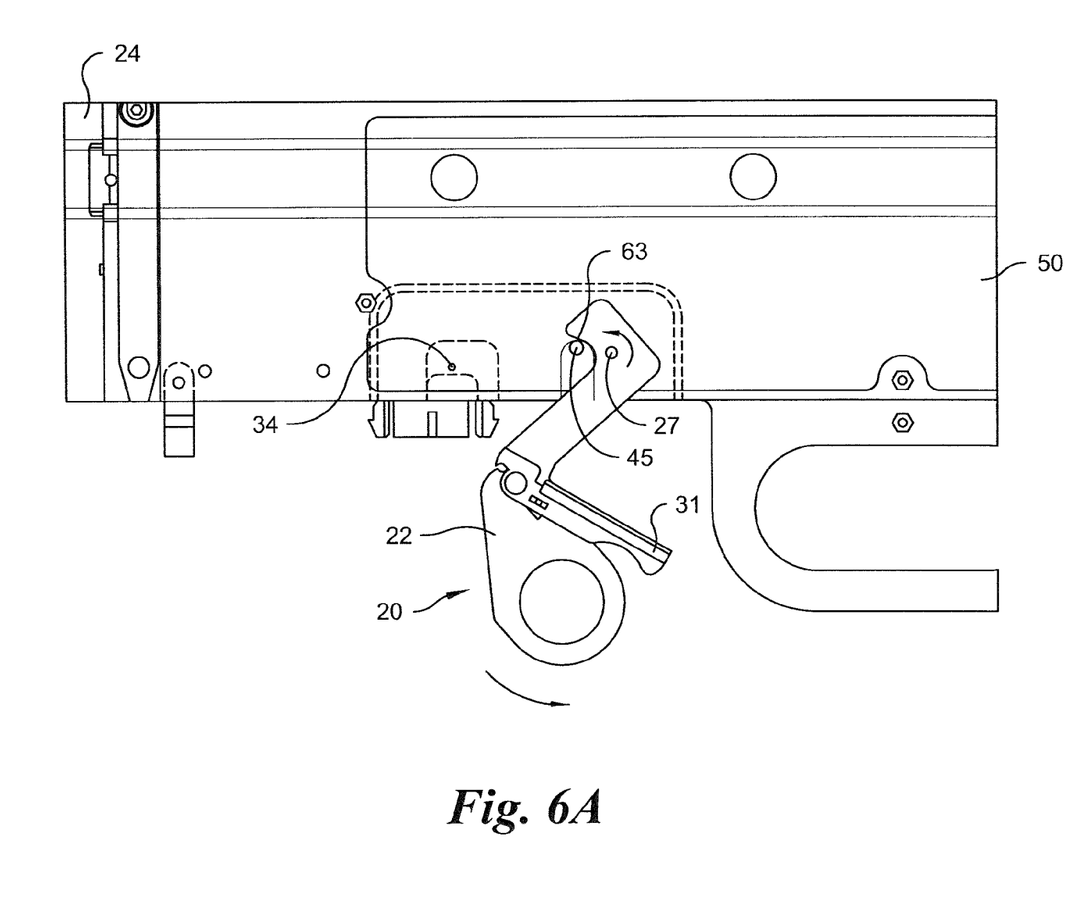
FIGS. 6A and 6B are perspective views illustrating a circuit card extraction function of a system according to an embodiment of the present disclosure.
Figure 6B:
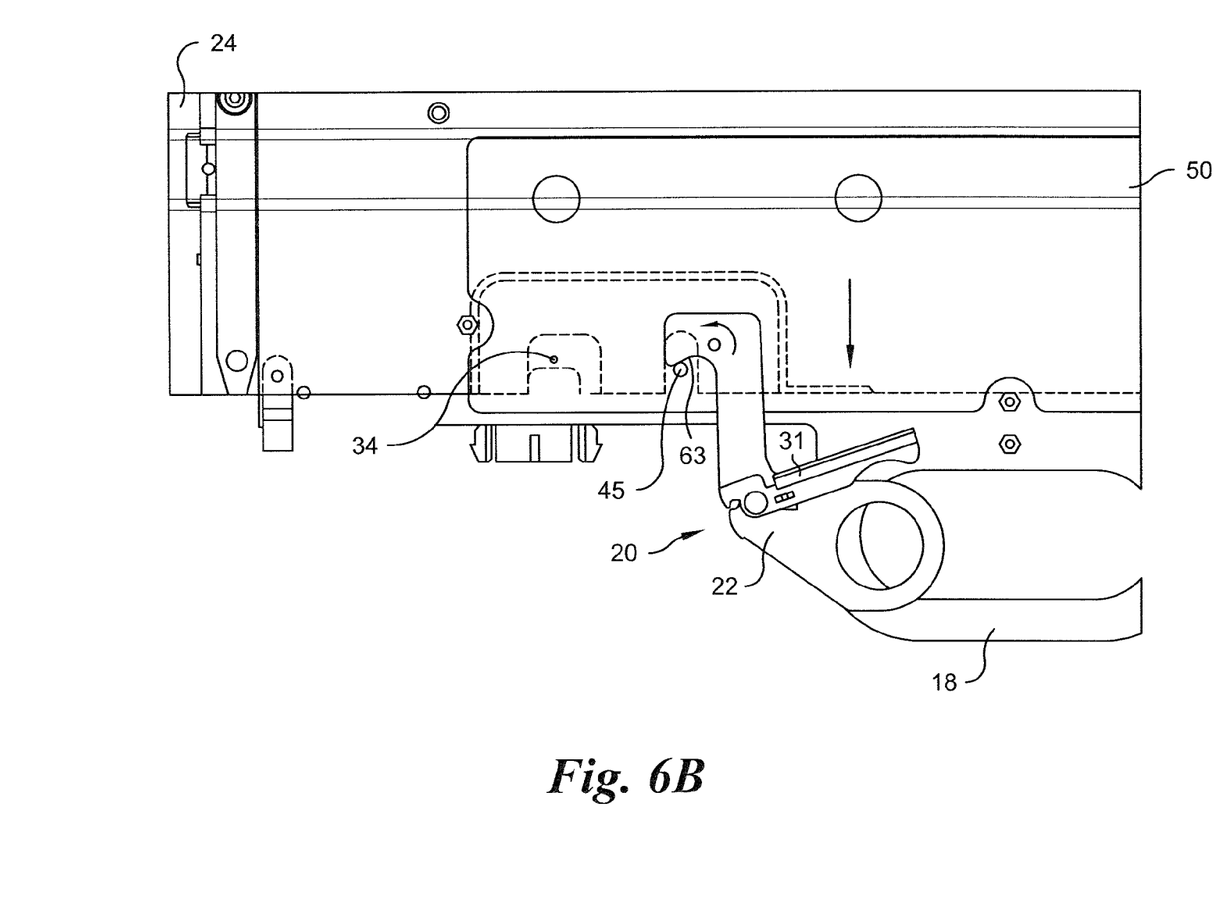

Still referring to FIG. 5C, extracting circuit card 50 from the illustrated installed position includes biasing locking catch 31 into an unlocked position. This may be achieved by, for example, rotating locking catch 31 in a clockwise fashion, against the bias placed thereon by spring element 38. Once in an unlocked position, lever 22 may be rotated counter-clockwise, disengaging locking catch 31 and lever 22 from locking pin 34. Referring to FIG. 6A, continued rotation of lever 22 in the counter-clockwise direction places second bearing surface 63 of lever 22 into contact engagement with bearing pin 45 of circuit card 50. As illustrated in FIG. 6B, further counter-clockwise rotation of lever 22 is operative to bias circuit card 50 in the illustrated direction and into an at least partially uninstalled or extracted position via the application of force on bearing pin 45 by bearing surface 63 of lever 22. From this position, circuit card 50 may be removed from receiving platform 24 via handle 18 by a user.

It should be understood that embodiments of the present disclosure provide several advantages over arrangements of the prior art. For example, the systems described herein are mounted to receiving platforms, rather than to the circuit cards themselves. As described above, this arrangement provides numerous advantages, including cost reductions over systems utilizing card-mounted solutions. Moreover, embodiments provide for both the ability to insert, as well as extract, circuit cards from a receiving platform or system, unlike prior art receiving side mounted arrangements, which only aid in extraction operations. Further still, embodiments of the present disclosure provide increased leverage or mechanical advantage via the usage of the rotatable mounted levers and/or handles. In this way, a user may more easily generate the force necessary to insert and/or extract a circuit card from the receiving system. In this way, embodiments of the present disclosure may provide for more expedient and efficient repair and/or replacement operations. Moreover, as a result of the locking functions described herein, embodiments of the present disclosure provide a means to secure and retain a circuit card in an installed state.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A system for selectively inserting and/or extracting an electronics module into and/or from a receiving system comprising:
    a lever configured to rotatably attach to a portion of the receiving system, the lever rotatable between a first position corresponding to an at least partially uninstalled position of the electronics module with respect to the receiving system and a second position corresponding to an installed position of the electronics module with respect to the receiving system, the lever comprising:
    a first bearing surface configured to engage with and apply a force on a portion of the electronics module when the lever is rotated in a first direction, wherein via the force applied by said first bearing surface, said lever is operable to urge the electronics module from the first at least partially uninstalled position into the second installed position; and
    a second bearing surface configured to engage with and apply a force on a portion of the electronic module when the lever is rotated in a second direction.

2. The system of claim 1, further comprising a locking mechanism attached to the lever and moveable between a first unlocked position and a second locked position, the locking mechanism configured to selectively engage with a portion of the receiving system in the second locked position when the lever is in the second position for preventing the lever from being rotated with respect to the receiving system.

3. The system of claim 2, wherein the locking mechanism comprises a locking catch rotatably mounted to the lever.

4. The system of claim 3, wherein the locking mechanism further comprises a spring for biasing the locking catch into the second locked position.

5. The system of claim 3, wherein the locking catch is configured to engage with a locking pin of the receiving system in the second locked position.

6. The system of claim 1, wherein the first bearing surface of the lever is configured to engage with a bearing pin arranged on the electronics module for inserting the electronics module into the receiving system when the lever is rotated in the first direction, and wherein the second bearing surface of the lever is configured to engage with the bearing pin arranged on an electronics module for extracting the electronics module from the receiving system when the lever is rotated in the second direction.

7. A system for selectively inserting and/or extracting an electronics module into and/or from a receiving system comprising:
    a lever configured to rotatably attach to a portion of the receiving system, the lever rotatable between a first position corresponding to an at least partially uninstalled position of the electronics module with respect to the receiving system and a second position corresponding to an installed position of the electronics module with respect to the receiving system, the lever comprising:
    a first bearing surface configured to engage with and apply a force on a portion of the electronics module when the lever is rotated in a first direction; and
    a second bearing surface configured to engage with and apply a force on a portion of the electronic module when the lever is rotated in a second direction, wherein the lever comprises a major elongated portion defining the first bearing surface and a minor elongated portion defining the second bearing surface, wherein the major and minor elongated portions are arranged such that together they define an at least partial "L" shaped profile.

8. The system of claim 7, wherein a first plane defining at least a portion of the first bearing surface is oriented such that it intersects a second plane defining at least a portion of the second bearing surface at an acute angle.

9. A receiving system for electronics modules, comprising:
    a receiving platform having a surface for supporting an electronics module;
    a lever rotatably mounted to the receiving platform, the lever rotatable between a first position corresponding to an at least partially uninstalled position of the electronics module with respect to the receiving system and a second position corresponding to an installed position of the electronics module with respect to the receiving system, the lever comprising:
    a first bearing surface configured to engage with a portion of the electronics module when the lever is rotated in a first direction, wherein the lever is operable to urge the electronics module from the first at least partially uninstalled position into the second installed position when the lever is rotated in the first direction; and
    a second bearing surface configured to engage with a portion of the electronics module when the lever is rotated in a second direction.

10. The system of claim 9, further comprising a locking mechanism movable between a first locked position wherein the lever is prevented from being rotated with respect to the receiving platform, and a second unlocked position wherein the lever is rotatable between the first and second positions.

11. The system of claim 10, wherein the locking mechanism comprises a locking catch rotatably mounted to the lever.

12. The system of claim 11, wherein the receiving platform comprises a locking pin arranged thereon, and wherein the locking catch is configured to engage with the locking pin in the first locked position.

13. The system of claim 11, wherein the locking catch is biased into the first locked position.

14. The system of claim 9, wherein the lever comprises a major elongated portion defining the first bearing surface and a minor elongated portion defining the second bearing surface, wherein the major and minor elongated portions are arranged such that together they define an at least partial "L" shaped profile.

15. The system of claim 9, wherein the receiving platform comprises a recessed area formed therein, and the lever is rotatably mounted to a surface of the recessed area generally parallel to the surface for supporting the electronics module.

16. The system of claim 9, wherein the first bearing surface of the lever is configured to engage with a bearing pin arranged on the electronics module for inserting the electronics module into the receiving system when the lever is rotated in the first direction, and wherein the second bearing surface of the lever is configured to engage with the bearing pin arranged on an electronics module for extracting the electronics module from the receiving system when the lever is rotated in the second direction.

17. A method for inserting an electronics module into a receiving system comprising:
engaging, by a first bearing surface of a lever rotatably mounted to the receiving system, a portion of the electronics module, wherein the lever is rotatable between a first position corresponding to an at least partially uninstalled position of the electronics module with respect to the receiving system and a second position corresponding to an installed position of the electronics module with respect to the receiving system; and
displacing by urging the electronics module in a first direction from the first at least partially uninstalled position into the second installed position with respect to the receiving system via a force applied to the first bearing surface by rotation of the lever in a first direction into the second position.

18. The method of claim 17, further comprising the step of engaging a locking mechanism for preventing rotation of the lever with respect to the receiving system.

19. The method of claim 18, further comprising the step of releasing the locking mechanism for allowing rotation of the lever with respect to the receiving system.

20. The method of claim 19, further comprising the step of engaging a second bearing surface of a lever pivotally mounted to the receiving system with a portion of the electronics module; and
displacing the electronics module in a second direction from the installed position to an uninstalled position with respect to the receiving system via rotation of the lever in a second direction into the first position.

* * * * *